United States Patent
Scheiper et al.

(10) Patent No.: US 8,815,736 B2
(45) Date of Patent: Aug. 26, 2014

(54) METHODS OF FORMING METAL SILICIDE REGIONS ON SEMICONDUCTOR DEVICES USING DIFFERENT TEMPERATURES

(75) Inventors: Thilo Scheiper, Dresden (DE); Peter Javorka, Radeburg (DE); Stefan Flachowsky, Dresden (DE); Clemens Fitz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 407 days.

(21) Appl. No.: 13/218,089

(22) Filed: Aug. 25, 2011

(65) Prior Publication Data
US 2013/0052819 A1     Feb. 28, 2013

(51) Int. Cl.
*H01L 21/8238*     (2006.01)
*H01L 21/44*     (2006.01)
*H01L 21/285*     (2006.01)

(52) U.S. Cl.
CPC .. *H01L 21/28518* (2013.01); *H01L 21/823835* (2013.01); *H01L 21/823814* (2013.01)
USPC ........... 438/664; 438/199; 438/229; 438/301; 438/682; 257/E21.165; 257/E21.251; 257/E21.438; 257/E21.619

(58) Field of Classification Search
CPC ............... H01I 29/665; H01I 21/28052; H01I 29/4933; H01I 21/28518
USPC .......... 438/199, 257, 229, 301; 257/E21.165, 257/E21.251, E21.438, E21.619
See application file for complete search history.

(56) References Cited

U.S. PATENT DOCUMENTS

| | | | |
|---|---|---|---|
| 5,953,614 A | 9/1999 | Liu et al. | |
| 6,251,777 B1 | 6/2001 | Jeng et al. | |
| 6,268,255 B1 | 7/2001 | Besser et al. | |
| 6,537,910 B1 | 3/2003 | Burke et al. | |
| 6,767,796 B2 * | 7/2004 | Tanaka et al. | 438/299 |
| 6,815,235 B1 | 11/2004 | Markle | |
| 7,045,456 B2 | 5/2006 | Murto et al. | |
| 7,485,556 B2 | 2/2009 | Byun et al. | |
| 7,811,877 B2 | 10/2010 | Ramamurthy et al. | |
| 7,821,075 B2 * | 10/2010 | Snyder et al. | 257/371 |
| 7,985,668 B1 * | 7/2011 | Richter et al. | 438/583 |
| 2003/0059983 A1 * | 3/2003 | Ota et al. | 438/128 |
| 2009/0102014 A1 * | 4/2009 | Borot et al. | 257/530 |
| 2009/0218633 A1 * | 9/2009 | Hoentschel et al. | 257/369 |

* cited by examiner

*Primary Examiner* — Mohsen Ahmadi
(74) *Attorney, Agent, or Firm* — Amerson Law Firm, PLLC

(57) ABSTRACT

Disclosed herein are various methods of forming metal silicide regions on semiconductor devices by using different temperatures during the silicidation processes. In one example, the method includes forming a plurality of N-doped source/drain regions and a plurality of P-doped source/drain regions in a semiconducting substrate and performing a first heating process at a first temperature to initially form a first metal silicide region in each of the P-doped source/drain regions. The method further includes performing a second heating process at a second temperature to initially form a second metal silicide region in each of the N-doped source/drain regions, wherein the second temperature is less than the first temperature and performing a third heating process at a third temperature to complete the formation of the first and second metal silicide regions, wherein the third temperature is greater than the first temperature.

14 Claims, 6 Drawing Sheets

METHODS OF FORMING METAL SILICIDE REGIONS ON SEMICONDUCTOR DEVICES USING DIFFERENT TEMPERATURES

BACKGROUND OF THE INVENTION

1. Field of the Invention

Generally, the present disclosure generally relates to the manufacturing of sophisticated semiconductor devices, and, more specifically, to various methods of forming metal silicide regions on semiconductor devices by using different temperatures during the silicidation processes.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed adjacent to the highly doped regions.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a NMOS transistor would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from above the PMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art.

In a field effect transistor, metal silicide regions are typically formed in the source/drain regions of a transistor to reduce the resistance when a conductive contact is formed to establish electrical connection to the source/drain regions. Such metal silicide regions may be made using a variety of different refractory metals, e.g., nickel, platinum, cobalt, etc., or combinations thereof, and they may be formed using techniques that are well known to those skilled in the art. The typical steps used to form metal silicide regions are: (1) depositing a layer of refractory metal, performing an initial heating process causing the refractory metal to react with underlying silicon containing material; (2) performing an etching process to remove unreacted portions of the layer of refractory metal and (3) performing an additional heating process to form the final phase of the metal silicide. The formation of metal silicide regions is becoming even more important as device dimensions decrease with the associated incorporation of very shallow source/drain regions in advanced devices. More specifically, in newer generation devices is important to accurately control the thickness and location of the metal silicide regions to avoid problems such as so-called spiking and piping whereby electrical short circuits can occur which may lead to reduced device performance or, in a worst case, complete device failure.

The present disclosure is directed to various methods of forming metal silicide regions on semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal silicide regions on semiconductor devices by using different temperatures during the silicidation processes. In one example, the method includes forming a plurality of N-doped source/drain regions and a plurality of P-doped source/drain regions in a semiconducting substrate and performing a first heating process at a first temperature to initially form a first metal silicide region in each of the P-doped source/drain regions. The method further includes performing a second heating process at a second temperature to initially form a second metal silicide region in each of the N-doped source/drain regions, wherein the second temperature is less than the first temperature and performing a third heating process at a third temperature to complete the formation of the first and second metal silicide regions, wherein the third temperature is greater than the first temperature.

BRIEF DESCRIPTION OF THE DRAWINGS

The disclosure may be understood by reference to the following description taken in conjunction with the accompanying drawings, in which like reference numerals identify like elements, and in which.

Figure 1A:
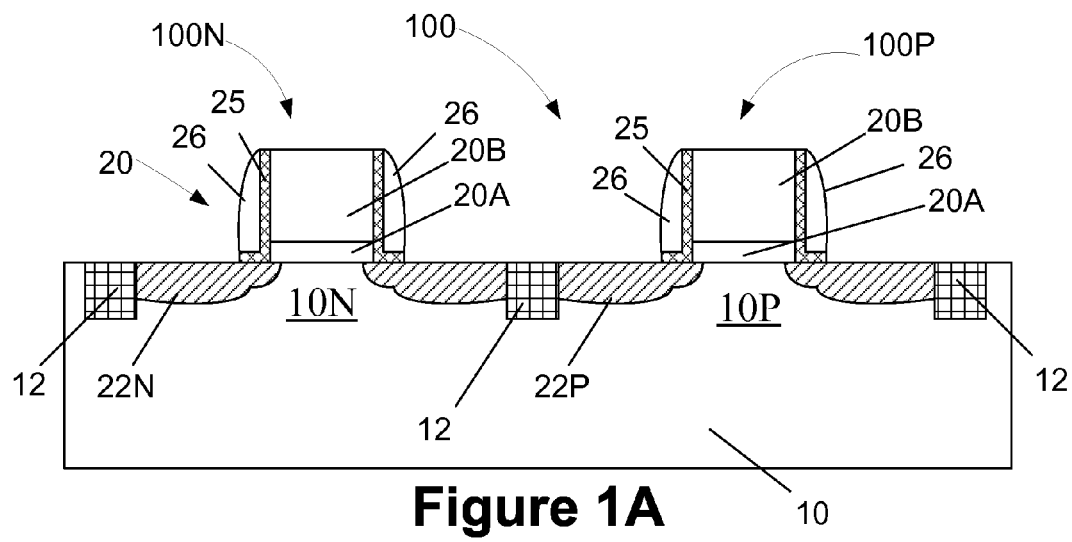
FIGS. 1A-1M depict one illustrative method of forming metal silicide regions on semiconductor devices by using different temperatures during the silicidation processes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming metal silicide regions on semiconductor devices by using different temperatures during the silicidation processes while reducing or perhaps eliminating at least some of the problems discussed in the background section of this application. In some cases, the methods and devices may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 1A-1M, various illustrative embodiments of the methods and devices disclosed herein will now be described in more detail.

FIG. 1A is a simplified view of an illustrative semiconductor device 100 at an early stage of manufacturing that is formed above a semiconducting substrate 10. The device 100 generally comprises an illustrative NMOS transistor 100N and an illustrative PMOS transistor 100P formed in and above an NMOS region 10N and a PMOS region 10P, respectively, of the substrate 10. The active regions 10N, 10P are defined by illustrative trench isolation structures 12 formed in the substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

At the point of fabrication depicted in FIG. 1A, each of the NMOS transistor 100N and an illustrative PMOS transistor 100P includes a schematically depicted gate electrode structure 20 that typically includes an illustrative gate insulation layer 20A and an illustrative gate electrode 20B. The gate insulation layer 20A may be comprised of a variety of different materials, such as, for example, silicon dioxide, a so-called high-k (k greater than 10) insulation material, etc. Similarly, the gate electrode 20B may also be of a material such as polysilicon or amorphous silicon, or it may be comprised of one or more metal layers that act as the gate electrode 20B. As will be recognized by those skilled in the art after a complete reading of the present application, the gate electrode structure 20 of the device 100 depicted in the drawings, i.e., the gate insulation layer 20A and the gate electrode 20B, is intended to be representative in nature. That is, the gate electrode structures 20 may be comprised of a variety of different materials and may they have a variety of configurations, and the gate electrode structures 20 may be made using either so-called "gate-first" or "gate-last" techniques. The gate electrode structure for the NMOS transistor 100N may contain different materials than the gate electrode structure 20 of the PMOS transistor 100P. For ease of explanation, the illustrative transistors 100N, 100P will be depicted as having polysilicon gate electrodes 20B, however, the present invention should not be considered as limited to such an illustrative embodiment.

Also as depicted in FIG. 1A, each of the transistors 100N, 100P also includes a plurality of source/drain regions 22N, 22P, respectively, a liner layer 25, and a sidewall spacer 26 formed proximate the gate electrode structures 20. In one illustrative example, the liner layer 25 may be made of a material such as silicon dioxide, while the sidewall spacer 26 may be made of, for example, silicon nitride. The various structures and regions of the transistors 100N, 100P depicted in FIG. 1A may be formed by performing well known processes. For example, the gate structures 20 may be formed by depositing various layer of material and thereafter performing one or more etching processed to define the basic layer stack of the gate electrode structures 20. The liner layer 25 may be comprised a relatively thin, e.g., 2-3 nm, layer of, for example, silicon dioxide, that is formed by performing a conformal chemical vapor deposition (CVD) process. The sidewall spacer 26 may be formed by depositing a layer of spacer material, such as silicon nitride, and thereafter performing an anisotropic etching process on the layer of spacer material. The source/drain regions 22N, 22P may be formed using know ion implantation techniques using the appropriate dopant materials, i.e., N-type dopants and P-type dopants, respectively.

Figure 1B:
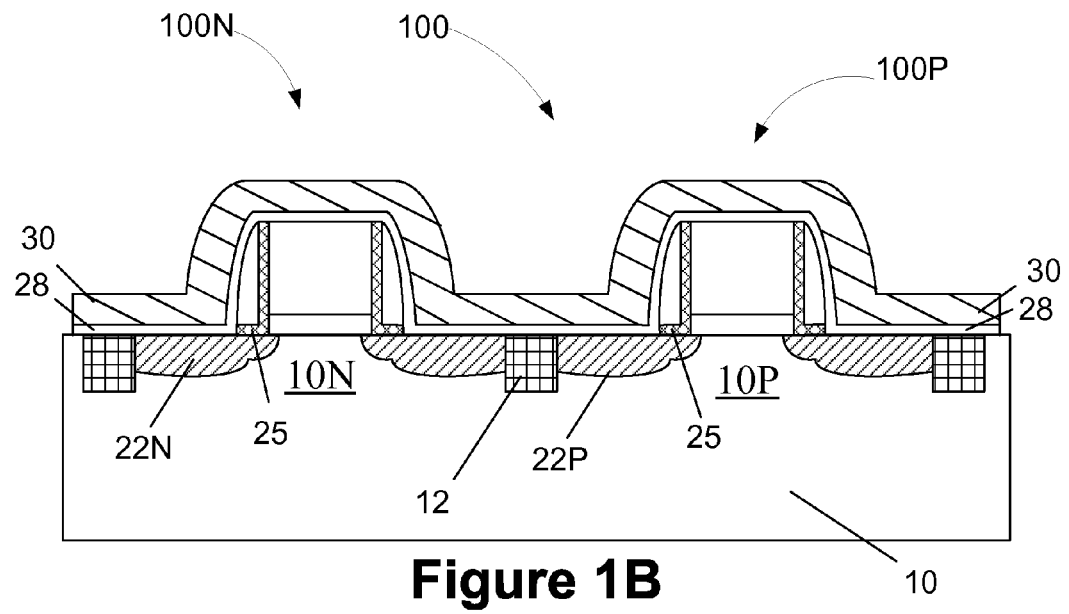

Next, as shown in FIG. 1B an etch stop layer 28 and a hard mask layer 30 are formed above the device 100. The layers 28 and 30 may be formed from a variety of materials and they may be formed by performing a variety of known techniques. In one illustrative example, the etch stop layer 28 may be comprised of silicon dioxide, it may have a thickness of about 5-10 nm, and it may be formed by performing a process such as a CVD process or an atomic layer deposition (ALD) process. The hard mask layer 30 may be comprised of a variety of different materials, such as silicon nitride, silicon oxynitride, etc. In one illustrative example, the hard mask layer 30 may be made of silicon nitride, it may have a thickness of about 30-40 nm and it may be formed by performing a CVD process.

Figure 1C:
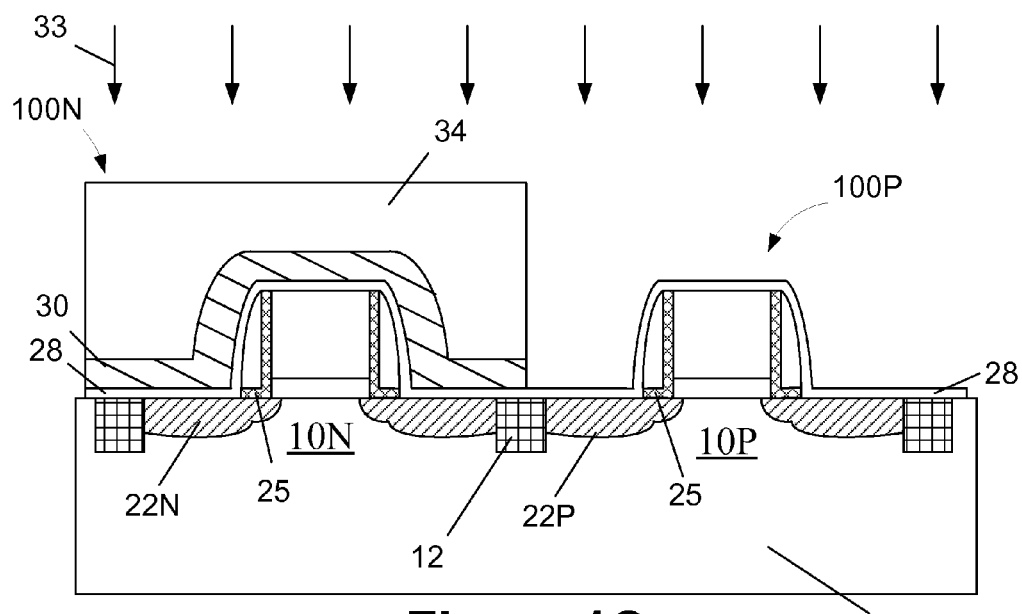

Next, as shown in FIG. 1C, a masking layer 34, e.g., a photoresist mask is formed on the device 100 to cover the NMOS transistor 100N while leaving the PMOS transistor 100P exposed for further processing. Thereafter, one or more etching processes, schematically depicted by the arrows 33, are performed to remove the hard mask layer 30 from above the PMOS transistor 100P. This etching process 33 may be performed using a wet etching technique or a dry etching technique, such as reactive ion etching (RIE).

Figure 1D:
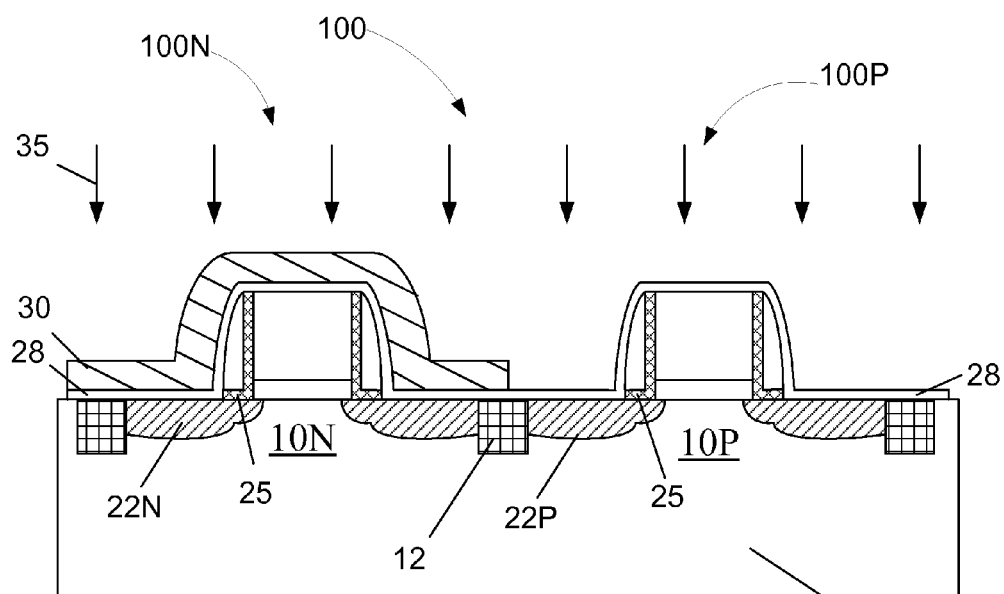

Then, as shown in FIG. 1D, in one illustrative embodiment, a heating or anneal process, as schematically depicted by the arrows 35, may be performed to activate implanted dopant materials on both on the NMOS transistor 100N and the PMOS transistor 100P. This anneal process 35 may be performed using a variety of techniques, such as a rapid thermal anneal (RTA) process, a laser anneal process, or a flash anneal process, etc. In one illustrative example, the heating process 35 is an RTA process that is performed at a temperature of about 1050 C for a duration of about 2 seconds. In this particular example, the heating process 35 causes the hard mask layer 30 to exert a desired tensile stress on the channel region of the NMOS transistor 100N. Of course, the heating process 35 may be performed earlier to activate the implanted dopant materials, and the mask layer 30 may not be subjected to this anneal process 35, depending upon the selected process flow for manufacturing the device 100.

Figure 1E:
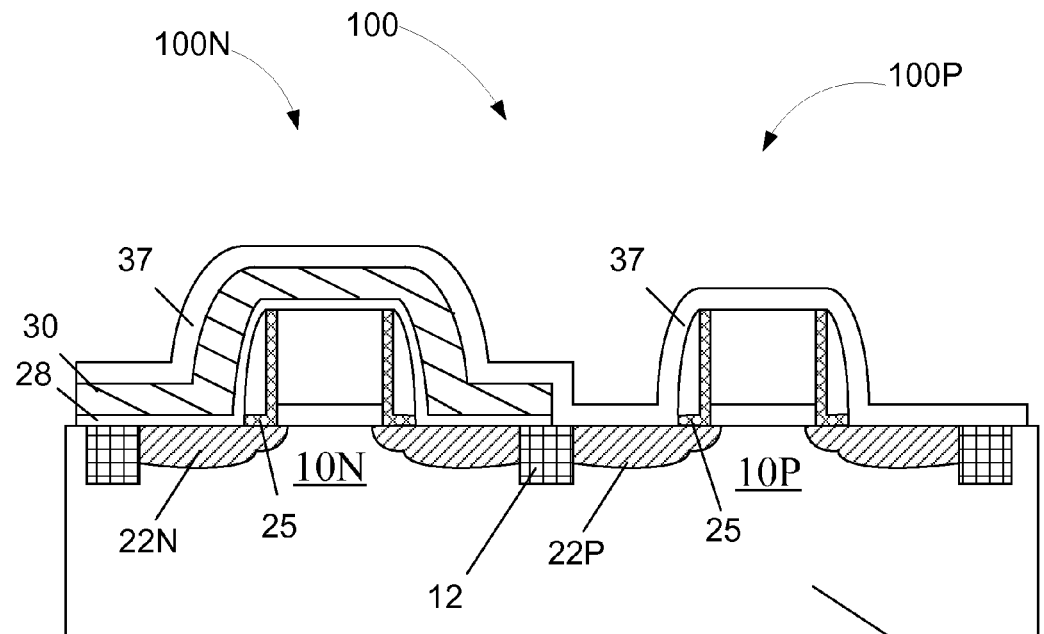

Next, as shown in FIG. 1E, a pre-silicide cleaning process is performed to remove the etch stop layer 28 above the P-active region 10P of the device 100 and to ensure that the surface of the substrate 10 is clean prior to forming metal silicide regions for the PMOS transistor 100P. This pre-clean etching process may be performed using a wet etching technique with, for example, a hot HF acid. Thereafter, a layer of refractory metal 37 is formed above the device 100. The layer of refractory metal 37 may be comprised of a variety of different refractory metals, such as nickel, cobalt, platinum, nickel-platinum, etc. or combinations thereof. The layer of refractory metal 37 may have a thickness of about 10-12 nm and it may be formed by performing a conformal CVD process.

Figure 1F:
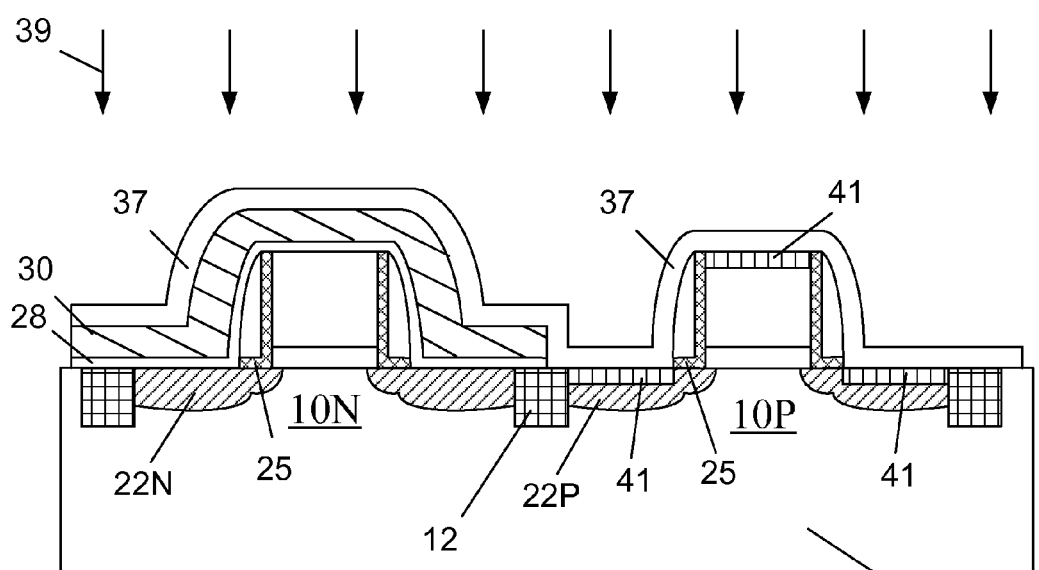

Thereafter, as shown in FIG. 1F, an anneal process 39 is performed as the first step of two anneal processes that is performed to form the metal silicide regions 41 in the P-doped source/drain regions 22P and in the gate electrode 20B for the PMOS transistor 100P. This initial anneal process 39 determines, to a great extent, the depth of the metal silicide regions 41. In one illustrative embodiment, the initial silicidation anneal process 39 is an RTA process that is performed at a temperature ranging from about 320-350° C., and in an even more particular example, at a temperature of about 330° C., for a duration of about 30 seconds. As shown in FIG. 1M, to the extent there are other passive or slave devices 50, such as resistors and fuses, formed on the device 100, metal silicide regions 41 on such slave devices 50 may be formed at the same time that the metal silicide regions 41 are formed on the PMOS transistor 100P, by using the same processing techniques as described herein.

Figure 1G:
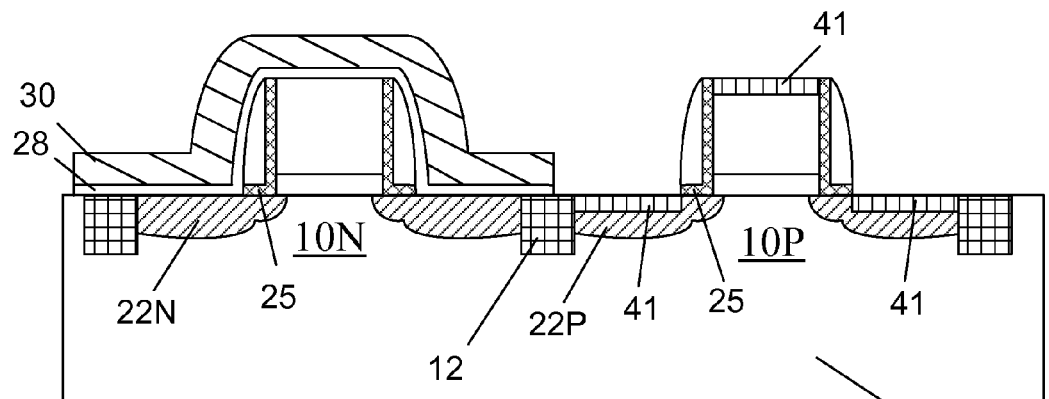

Next, as shown in FIG. 1G, an etching process is performed to remove unreacted portions of the layer of refractory metal layer 37. This etching process, which is typically a wet etching process, may be performed using a variety of different chemistries, such as $HNO_3$ or aqua regia.

Figure 1H:
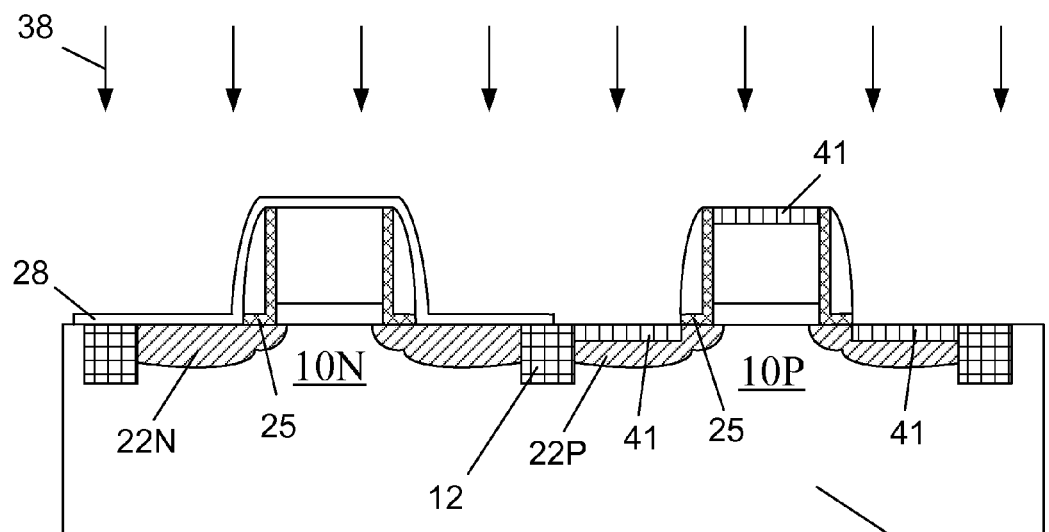

Next, as shown in FIG. 1H, one or more etching processes, schematically depicted by the arrows 38, are performed to remove the hard mask layer 30 from above the NMOS transistor 100N. This etching process 38 may be performed using a wet etching technique or a dry etching technique, such as reactive ion etching (RIE).

Figure 1I:
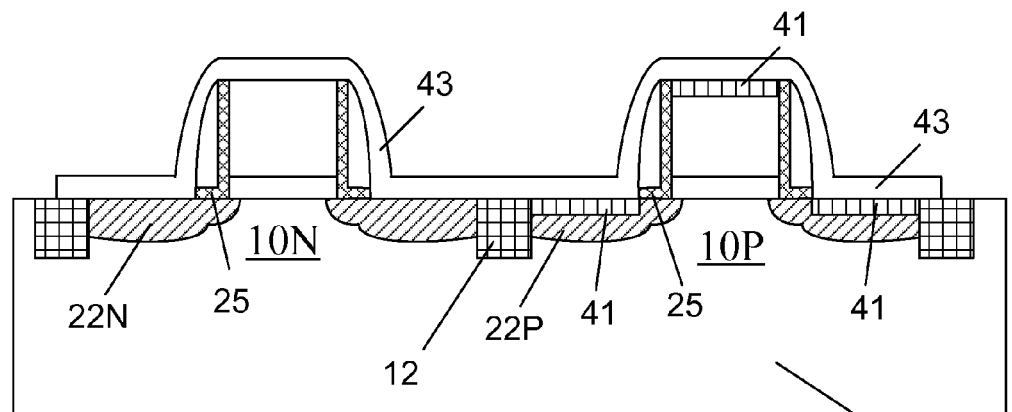

Next, as shown in FIG. 1I, a pre-silicide cleaning process is performed to remove the etch stop layer 28 above the N-active region 10N of the device 100 and to ensure that the surface of the substrate 10 is clean prior to forming metal silicide regions for the NMOS transistor 100N. This pre-clean etching process may be performed using a wet etching technique with, for example, a hot HF acid. Thereafter, a layer of refractory metal 43 is formed above the device 100. The layer of refractory metal 43 may be comprised of a variety of different refractory metals, such as nickel, cobalt, platinum, nickel-platinum, etc. or combinations thereof. The layer of refractory metal 43 may have a thickness of about 10-12 nm and it may be formed by performing a CVD process.

Figure 1J:
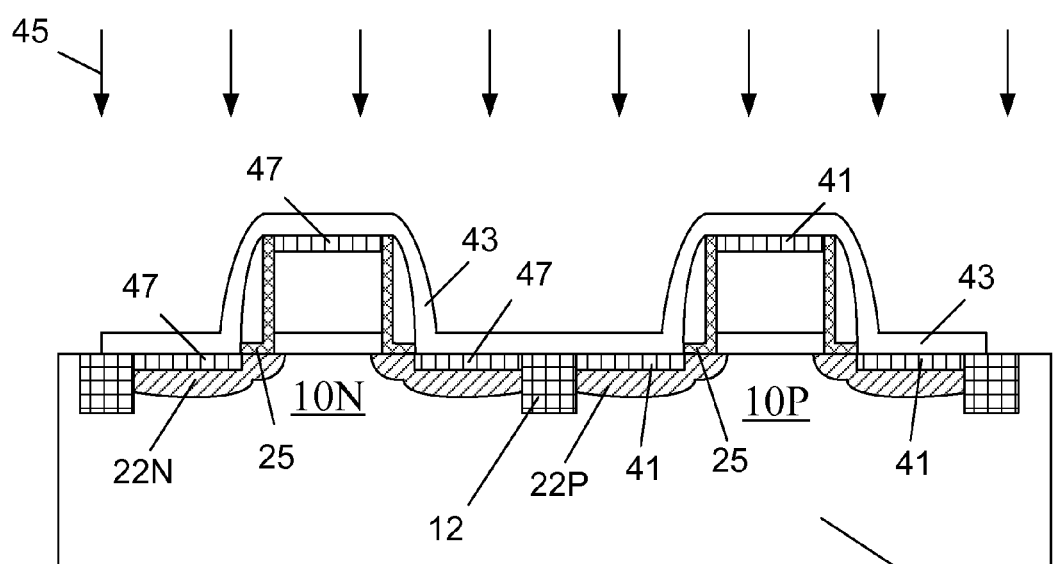

Thereafter, as shown in FIG. 1J, an anneal process 45 is performed as the first step of two anneal processes that is performed to form the metal silicide regions 47 in the N-doped source/drain regions 22N and in the gate electrode 20B for the NMOS transistor 100N. This initial anneal process 45 determines, to a great extent, the depth of the metal silicide regions 47. In one illustrative embodiment, the initial silicidation anneal process 45 is an RTA process that is performed at a temperature ranging from about 270-300° C., and in an even more particular example, at a temperature of about 290° C., for a duration of about 30 seconds. Note that the initial anneal process 45 performed to form the metal silicide regions 47 on the NMOS transistor 100N is performed at a temperature that is less than the initial anneal process 39 performed to form the metal silicide regions 41 on the PMOS transistor 100P. In one particular embodiment, the initial silicide anneal process 45 performed to form metal silicide regions 47 on the NMOS transistor 100N is performed at a temperature that is at least 20° C. less than the initial silicide anneal process 39 performed to form metal silicide regions 41 on the PMOS transistor 100P. The metal silicide regions 47 on the NMOS transistor 100N and the metal silicide regions 41 on the PMOS transistor 100P may be made of the same or different metal silicides. In one illustrative example, the metal silicide regions 47 and the metal silicide regions 41 have thicknesses of about 15 nm and 20 nm, respectively, and they are both comprised of nickel-platinum silicide. The metal silicide regions 47 are thinner than the metal silicide regions 41 due to the lower temperature of the heating process 45 as compared to the heating process 39. As noted earlier, depending upon the construction of the gate electrode 20B, a metal silicide region may not be present on the gate electrode of one or both of the transistors 100N, 100P.

Figure 1K:
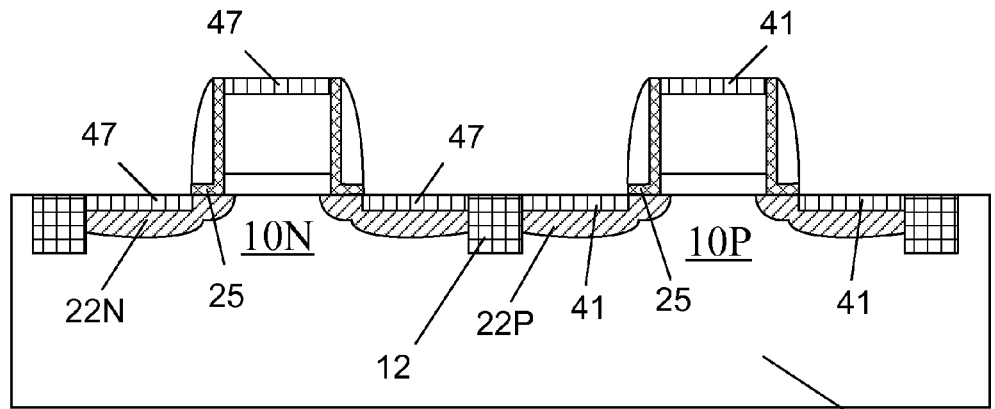

Next, as shown in FIG. 1K, an etching process is performed to remove unreacted portions of the layer of refractory metal layer 43. This etching process, which is typically a wet etching process, may be performed using a variety of different chemistries, such as $HNO_3$ or aqua regia.

Figure 1L:
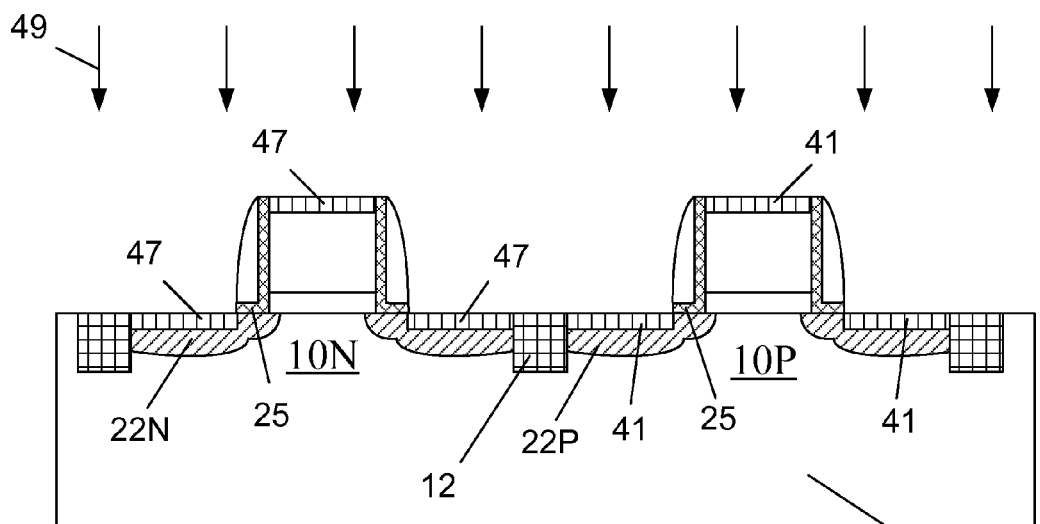
Figure 1M:
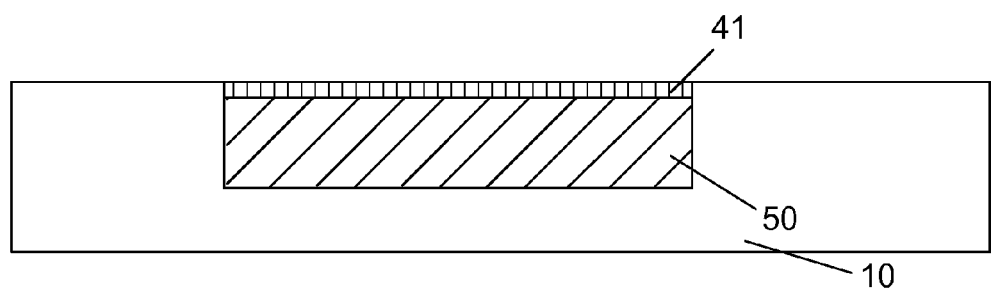

Thereafter, as shown in FIG. 1L, an anneal process 49 is performed on the device 100 as the final step of the two step anneal process that is performed to form the metal silicide regions 47 on the NMOS transistor 100P and the metal silicide regions 41 on the PMOS transistor 100P. This second step in the silicidation process defines the final phase and quality of the metal silicide regions 41, 47. In one illustrative embodiment, the anneal process 49 is an RTA process that is performed at a temperature ranging from 400-500 C and, in one particular example, at a temperature of about 450° C., for a duration of about 30 seconds.

Thereafter, various additional processing operations may be performed to complete the fabrication of the device 100. Such processing operations include the formation of conductive contacts (not shown) and the formation various metallization layers and structures (not shown) above the device 100.

The inventors have discovered that the performing the initial silicide anneal process at different temperatures for NMOS transistors and PMOS transistors can have an impact of the electrical performance characteristics of the transistor. More specifically, based upon data obtained when illustrative nickel-platinum silicide regions on an NMOS transistor, the inventors observed that the $I_{on}/I_{off}$ performance characteristics of the NMOS transistor improved when the initial silicide anneal process temperature was performed at a relatively lower temperature instead of a relatively higher temperature. The inventors also observed that PMOS transistors exhibit the opposite behavior—that is, the $I_{on}/I_{off}$ performance characteristics of the PMOS transistors improved when the initial silicide anneal process temperature was performed at a relatively higher temperature instead of a relatively lower temperature. It was also observed that certain slave devices, like a fuse, behaved in the same manner as the PMOS transistors. That is, performing the initial silicide anneal process temperature was performed at a relatively higher temperature instead of a relatively lower temperature, tended to cause the resistance of the fuse to decrease, whereas performing the initial silicide anneal process temperature at a relatively lower temperature instead of a relatively higher temperature tended to cause the resistance of the fuse to increase. Thus, using the techniques disclosed herein, the electrical resistance of the resistor can by controlled, or maintained within a desirable range, by controlling the temperature of the initial silicide anneal process temperature that is performed to form a metal silicide layer of the resistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of N-doped source/drain regions for NMOS transistors and a plurality of P-doped source/drain regions for PMOS transistors in a semiconducting substrate;
    performing a first heating process at a first temperature to initially form a first metal silicide region in each of said P-doped source/drain regions;
    performing a second heating process at a second temperature to initially form a second metal silicide region in each of said N-doped source/drain regions, wherein said second temperature is at least 30° C. less than said first temperature; and
    performing a third heating process at a third temperature on both the N-doped source/drain regions and the P-doped source/drain regions to complete the formation of said first and second metal silicide regions, said third temperature being greater than said first temperature.

2. The method of claim 1, wherein said third temperature is at least 400° C.

3. The method of claim 1, wherein said first temperature ranges from 320-350° C.

4. The method of claim 3, wherein said second temperature ranges from 270-300° C.

5. The method of claim 1, wherein said first metal silicide region and said second metal silicide region are comprised of nickel silicide.

6. The method of claim 1, further comprising forming a slave device comprised of at least one of a resistor or a fuse in said substrate, and wherein the method further comprises performing said first heating process at said first temperature to initially form a third metal silicide region in said slave device and performing said third heating process at said third temperature to complete the formation of said third metal silicide region.

7. A method, comprising:
    forming a plurality of N-doped source/drain regions for NMOS transistors and a plurality of P-doped source/drain regions for PMOS transistors in a semiconducting substrate;
    performing a first heating process at a first temperature ranging from 320-350° C. to initially form a first metal silicide region in each of said P-doped source/drain regions;
    performing a second heating process at a second temperature ranging from 270-300° C. to initially form a second metal silicide region in each of said N-doped source/drain regions; and
    performing a third heating process at a third temperature that is at least 400° C. on both the N-doped source/drain regions and the P-doped source/drain regions to complete the formation of said first and second metal silicide regions.

8. The method of claim 7, wherein said first metal silicide region and said second metal silicide region are comprised of nickel silicide.

9. The method of claim 7, further comprising forming a slave device comprised of at least one of a resistor or a fuse in said substrate, and wherein the method further comprises performing said first heating process at said first temperature to initially form a third metal silicide region in said slave device and performing said third heating process at said third temperature to complete the formation of said third metal silicide region.

10. A method, comprising:
    forming a plurality of N-doped source/drain regions for NMOS transistors and a plurality of P-doped source/drain regions for PMOS transistors in a semiconducting substrate;
    forming a first layer of refractory metal on said P-doped source/drain regions while masking said N-doped source/drain regions;
    performing a first heating process at a first temperature to initially form a first metal silicide region in each of said P-doped source/drain regions;
    removing unreacted portions of said first layer of refractory metal;
    forming a second layer of refractory metal on said N-doped source/drain regions;
    performing a second heating process at a second temperature to initially form a second metal silicide region in each of said N-doped source/drain regions, said second temperature being less than said first temperature;
    removing unreacted portions of said second layer of refractory metal; and
    performing a third heating process at a third temperature on both the N-doped source/drain regions and the P-doped source/drain regions to complete the formation of said first and second metal silicide regions, said third temperature being greater than said first temperature.

11. The method of claim 10, wherein said first temperature ranges from 320-350° C.

12. The method of claim 11, wherein said second temperature ranges from 270-300° C.

13. The method of claim 12, wherein said third temperature is at least 400° C.

14. The method of claim 13, further comprising forming a slave device comprised of at least one of a resistor or a fuse in said substrate, and wherein the method further comprises performing said first heating process at said first temperature to initially form a third metal silicide region in said slave device and performing said third heating process at said third temperature to complete the formation of said third metal silicide region.

* * * * *